(12) United States Patent
Chen et al.

(10) Patent No.: US 10,050,187 B1
(45) Date of Patent: Aug. 14, 2018

(54) LIGHT-EMITTING DEVICE AND MANUFACTURING METHOD OF LIGHT-EMITTING DEVICE

(71) Applicant: TYNTEK CORPORATION, Hsinchu (TW)

(72) Inventors: Yi-Hung Chen, Miaoli County (TW); Yung-Jung Liang, Miaoli County (TW)

(73) Assignee: Tyntek Corporation, Hsinchu (TW)

( * ) Notice: Subject to any disclaimer, the term of this patent is extended or adjusted under 35 U.S.C. 154(b) by 0 days.

(21) Appl. No.: 15/723,382

(22) Filed: Oct. 3, 2017

(30) Foreign Application Priority Data

Feb. 13, 2017 (TW) .............................. 106104559 A

(51) Int. Cl.
| | |
|---|---|
| *H01L 29/205* | (2006.01) |
| *H01L 33/00* | (2010.01) |
| *H01L 33/62* | (2010.01) |
| *H01L 33/44* | (2010.01) |
| *H01L 33/36* | (2010.01) |
| H01L 33/38 | (2010.01) |

(52) U.S. Cl.
CPC .............. *H01L 33/62* (2013.01); *H01L 33/36* (2013.01); *H01L 33/44* (2013.01); *H01L 33/382* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 2010/0140637 A1* | 6/2010 | Donofrio | ................ | H01L 33/42 257/98 |
| 2016/0049564 A1* | 2/2016 | Chu | ........................ | H01L 25/50 257/99 |
| 2016/0118547 A1* | 4/2016 | Kawai | ................. | H01L 25/0753 257/88 |

* cited by examiner

*Primary Examiner* — Calvin Choi
(74) *Attorney, Agent, or Firm* — Rosenberg, Klein & Lee

(57) ABSTRACT

The light-emitting device includes a base plate, a bonding metal layer, a conductive oxide layer, an epitaxial layer, an insulation layer, a first ohmic contact layer, a second ohmic contact layer, a third ohmic contact layer, and a conductor line. The light-emitting device of the present invention uses the process of providing a conductor line to connect an ohmic contact layer, instead of wire bonding, so that a package process required by wire bonding can be eliminated to thereby reduce the size of the light-emitting device. Further, the light-emitting device, after the formation of the conductor line on the ohmic contact layer, allows for performance of a step of directly bonding to a circuit board so as to reduce the package size and simplify equipment necessary for the package process to thereby further lower down fabrication costs, achieving the effects of simplification of operation and fast fabrication.

23 Claims, 7 Drawing Sheets

LIGHT-EMITTING DEVICE AND MANUFACTURING METHOD OF LIGHT-EMITTING DEVICE

FIELD OF THE INVENTION

The present invention relates to a light-emitting device and a manufacturing method of a light-emitting device, and in particular to a light-emitting device and a manufacturing method of a light-emitting device that involves chip scale package through a design of wiring and a packaging process corresponding thereto.

BACKGROUND OF THE INVENTION

In the technical field of light-emitting devices, light-emitting diodes are a widely used product and they are applicable to various technical fields, particularly applications concerning thinned and small-sized products being increasingly widened, so that an increasing number of products are being under development toward "chip scale package". For example, a number of products that involve the use of light-emitting diodes are made with chip scale package by taking flip chip package for size reduction and thinning.

Referring to FIG. 1A, a schematic view is given to illustrate a structure of a known light-emitting diode. The known light-emitting diode 1 comprises a transparent base plate 11, epitaxial layers 12,13, an insulation layer 14, and electrodes 15, 16. In FIG. 1A, the electrodes 15, 16 are of horizontal electrode structures, and in a manufacturing process, a metal ball 17 is placed on the electrode 16 to make the electrodes 15, 16 identical in height. However, such a process of placing the metal ball 17 on the electrode 16 often results in a height difference between the electrodes 15 and 16 and this increases the product defect rate, and also increases potential risk and cost of fabrication.

Referring to FIG. 1B, an improvement over the structure of the light-emitting diode shown in FIG. 1A is provided. To overcome the issue of height difference between the electrodes 15, 16 due to the arrangement of the metal ball shown in FIG. 1A, FIG. 1B provides a structure of a light-emitting diode 1, in which a recess is formed with the insulation layer 14 and the electrode 16 is disposed in the recess in order to make the electrodes 15, 16 identical to each other in height. However, such a process requires an additional operation of forming the recess, and, in addition, since a base plate 11 used in flip chip packaging and the flip chip process of FIG. 1A both need a transparent base plate 11, alignment of the electrodes 15, 16 in making a package is difficult.

Further, if the techniques that involve flip chip packaging to achieve size reduction and thinning takes an eutectic process to form the structure of the light-emitting diode, then the equipment used for eutectic process requires a higher standard and thus, the fabrication cost may be increased.

Thus, it is an important contemporary technical issue to provide a process that makes a package that is closer to a chip size.

SUMMARY OF THE INVENTION

In view of the above, the present invention discloses a light-emitting device, which comprises a base plate, the bonding metal layer, the conductive oxide layer, the epitaxial layer, the insulation layer, the first ohmic contact layer, the second ohmic contact layer, the third ohmic contact layer and the conductor line. The bonding metal layer is disposed on a surface of a first part of the base plate. The conductive oxide layer is disposed on the bonding metal layer. The epitaxial layer is disposed on a surface of a first part of the conductive oxide layer. The insulation layer is disposed on a first side edge of the bonding metal layer, the conductive oxide layer, and the epitaxial layer and disposed on a surface of a first part of the epitaxial layer. The first ohmic contact layer is disposed on a surface of a second part of the base plate. The second ohmic contact layer is disposed on a surface of a second part of the epitaxial layer. The third ohmic contact layer is disposed on a surface of a second part of the conductive oxide layer. The conductor line electrically connects the first ohmic contact layer and the second ohmic contact layer to each other.

The present invention also discloses a manufacturing method of a light-emitting device, which comprises the following step: providing a first base plate; forming an epitaxial layer on the first base plate; forming a conductive oxide layer on the epitaxial layer; forming a first bonding metal layer on the conductive oxide layer; providing a second base plate; forming a second bonding metal layer on the second base plate; bonding the first bonding metal layer and the second bonding metal layer to each other; removing the first base plate; removing a portion of the epitaxial layer; removing a portion of the first bonding metal layer, the second bonding metal layer, and the conductive oxide layer; forming an insulation layer to cover the second base plate, the first bonding metal layer, the second bonding metal layer, the conductive oxide layer, and the epitaxial layer; removing portions of the insulation layer on the second base plate, the conductive oxide layer, and the epitaxial layer to expose, partly, a surface of the second base plate, a surface of the conductive oxide layer, and a surface of the epitaxial layer; forming a first ohmic contact layer on the surface of the second base plate; forming a second ohmic contact layer on the surface of the epitaxial layer; forming a third ohmic contact layer on the surface of the conductive oxide layer; and forming a conductor line to connect the first ohmic contact layer and the second ohmic contact layer to each other.

Based on the above, compared to the prior art, where a metal ball is disposed on an electrode and a recess is provided for the purposes of making the electrodes identical, in height, to each other, the present invention involves a process of providing a conductor line to more precisely control the height of electrode so as to prevent an issue associated with height difference of electrodes. Further, the light-emitting device of the present invention uses the process of providing a conductor line to connect an ohmic contact layer, instead of wire bonding, so that a package process required by wire bonding can be eliminated to thereby reduce the size of the light-emitting device. Further, the light-emitting device of the present invention, after the formation of the conductor line on the ohmic contact layer, allows for performance of a step of directly bonding to a circuit board so as to reduce the package size and simplify equipment necessary for the package process to thereby further lower down fabrication costs, achieving the effects of simplification of operation and fast fabrication, allowing for wide application to the technical field of chip size package.

BRIEF DESCRIPTION OF THE DRAWINGS

The present invention will be apparent to those skilled in the art by reading the following description of preferred embodiments thereof with reference to the drawings, in which.

DETAILED DESCRIPTION OF THE PREFERRED EMBODIMENTS

Figure 1A:
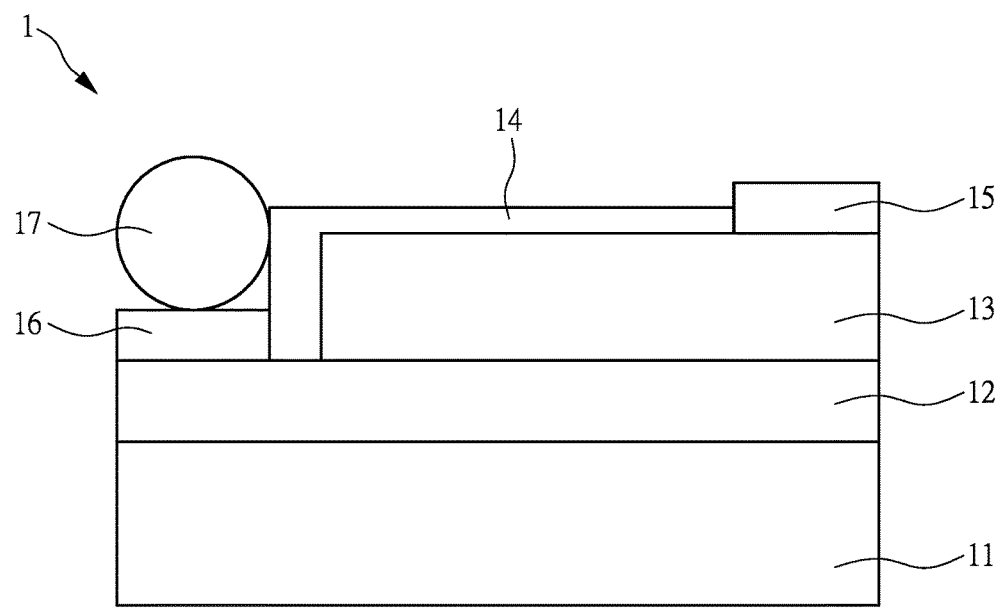
FIG. 1A is a schematic view showing a structure of a known light-emitting diode.
Figure 1B:
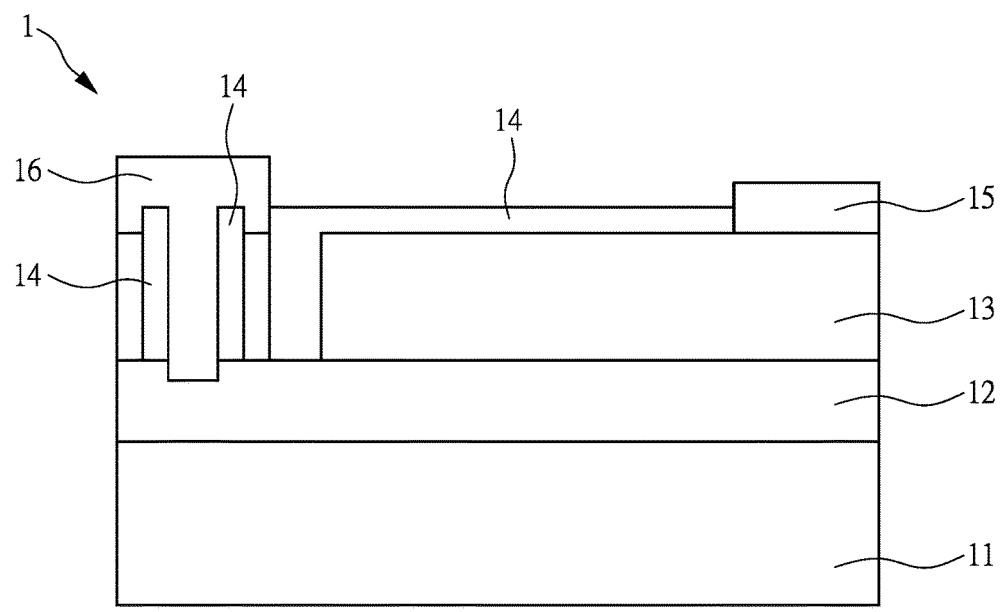
FIG. 1B is a schematic view illustrating an improvement of the structure of the light-emitting diode shown in FIG. 1A.
Figure 2:
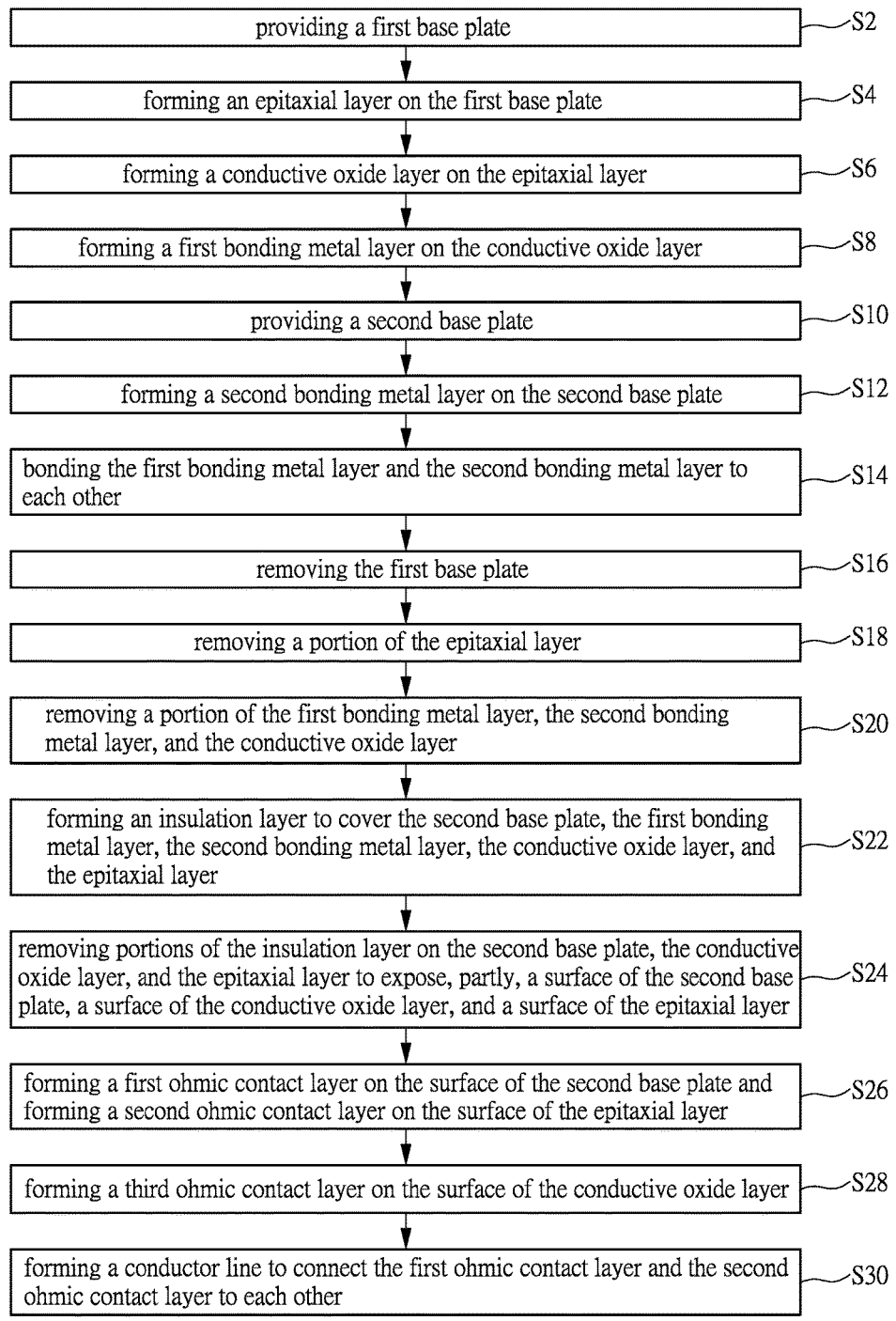
FIG. 2 is a flow chart illustrating a manufacturing method of a light-emitting device according to the present invention.

Referring to FIGS. 2 and 3A-3H, which respectively provide a flow chart illustrating a manufacturing method of a light-emitting device according to the present invention and different steps of the manufacturing method, the manufacturing method of a light-emitting device 3 generally comprises the following steps: in Step S2, a first base plate 31 is provided. In Step S4, an epitaxial layer 32 is formed on the first base plate 31. In Step S6, a conductive oxide layer 33 is formed on the epitaxial layer 32. In Step S8, a first bonding metal layer 34 is formed on the conductive oxide layer 33. In Step S10, a second base plate 35 is provided. In Step S12, a second bonding metal layer 36 is formed on the second base plate 35. In Step S14, the first bonding metal layer 34 and the second bonding metal layer 36 are bonded to each other. In Step S16, the first base plate 31 is removed. In Step S18, a portion of the epitaxial layer 32 is removed. In Step S20, a portion of the first bonding metal layer 34, the second bonding metal layer 36, and the conductive oxide layer 33 is removed. In Step S22, an insulation layer 37 is formed to cover the second base plate 35, the first bonding metal layer 34, the second bonding metal layer 36, the conductive oxide layer 33, and the epitaxial layer 32. In Step S24, portions of the insulation layer 37 that are located on the second base plate 35, the conductive oxide layer 33, and the epitaxial layer 32 are removed to expose a portion of a surface of the second base plate 35, a portion of a surface of the conductive oxide layer 33, and a portion of a surface of the epitaxial layer 32. In Step S26, a first ohmic contact layer E1 is formed on the surface of the second base plate 35 and a second ohmic contact layer E2 is formed on the surface of the epitaxial layer 32. In Step S28, a third ohmic contact layer E3 is formed on the surface of the conductive oxide layer 33. In Step S30, a conductor line 38 is formed to connect the first ohmic contact layer E1 and the second ohmic contact layer E2 to each other.

In the present invention, the second base plate 35 comprises a non-conductive plate and may selectively uses a light-transmitting plate or a non-light-transmitting plate.

The step of removing a portion of the epitaxial layer 32 comprises removing parts of the epitaxial layer 32 on a first side edge and a second side edge in order to expose portions of a surface of the conductive oxide layer 33 to allow for disposing the third ohmic contact layer E3 after the formation of the insulation layer 37.

The step of removing a portion of the first bonding metal layer 34, the second bonding metal layer 36, and the conductive oxide layer 33 comprises removing a part of the first bonding metal layer 34 on the first side edge, a part of the second bonding metal layer 36 on the first side edge, and a part of the conductive oxide layer 33 on the first side edge to allow for, after the removal, forming the insulation layer 37 and disposing the first ohmic contact layer E1 on a surface of the second base plate 35.

Figure 3A:
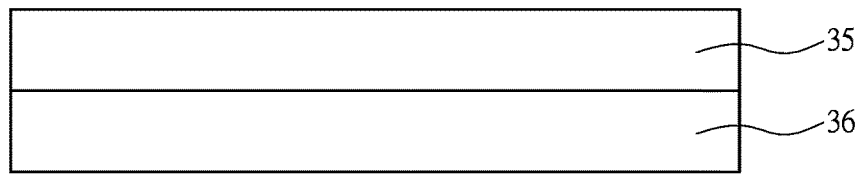
FIGS. 3A-3H are schematic views illustrating different steps of the manufacturing method of the light-emitting device according to the present invention.
Figure 3A:
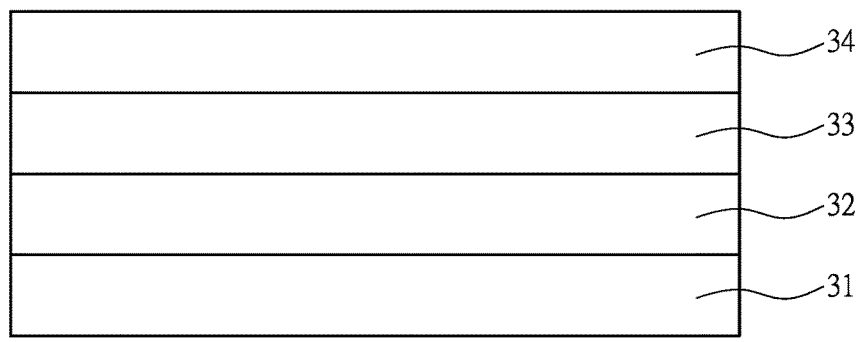
Figure 3B:
Figure 3C:
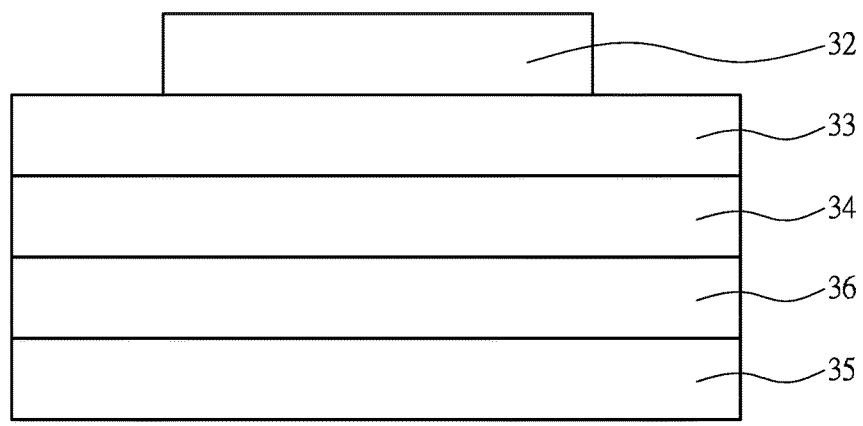
Figure 3D:
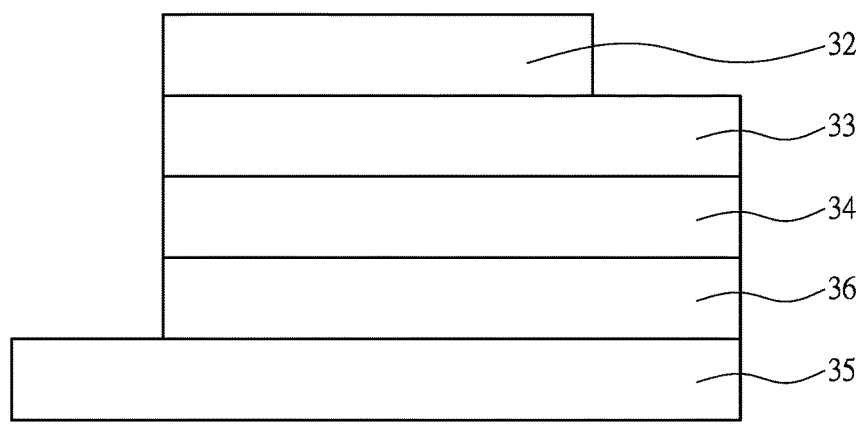
Figure 3E:
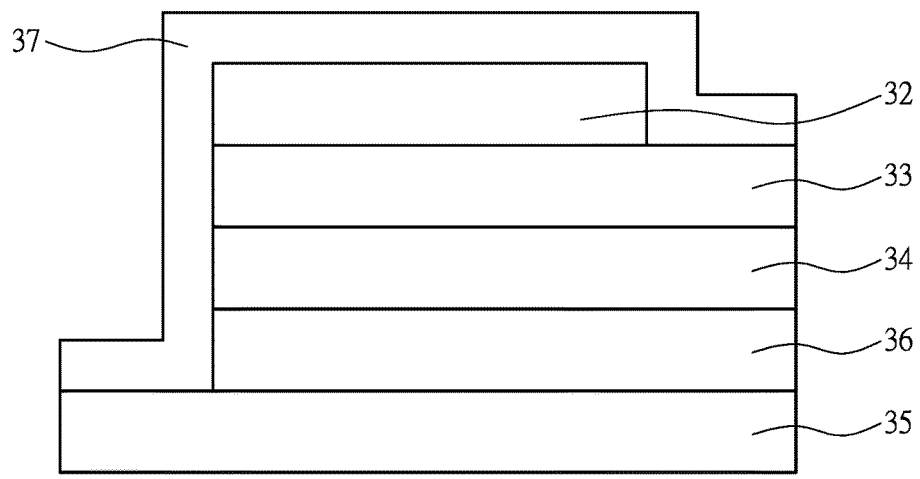
Figure 3F:
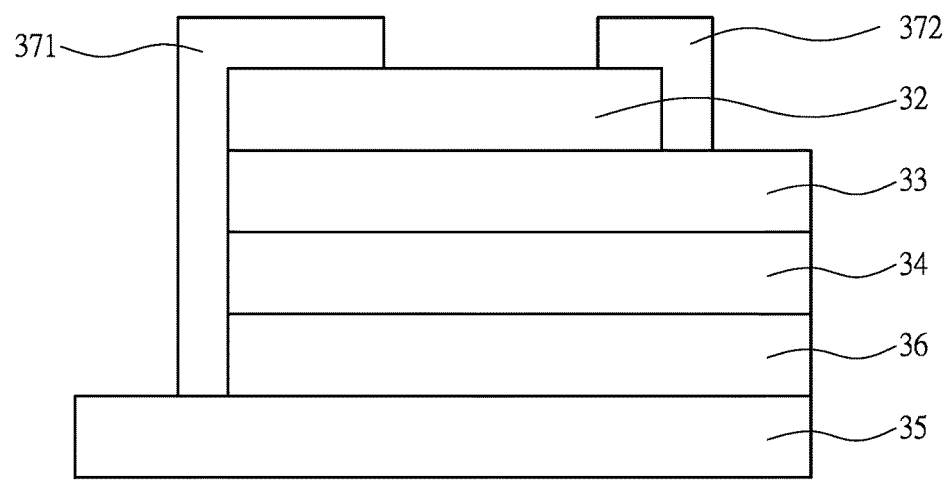
Figure 3G:
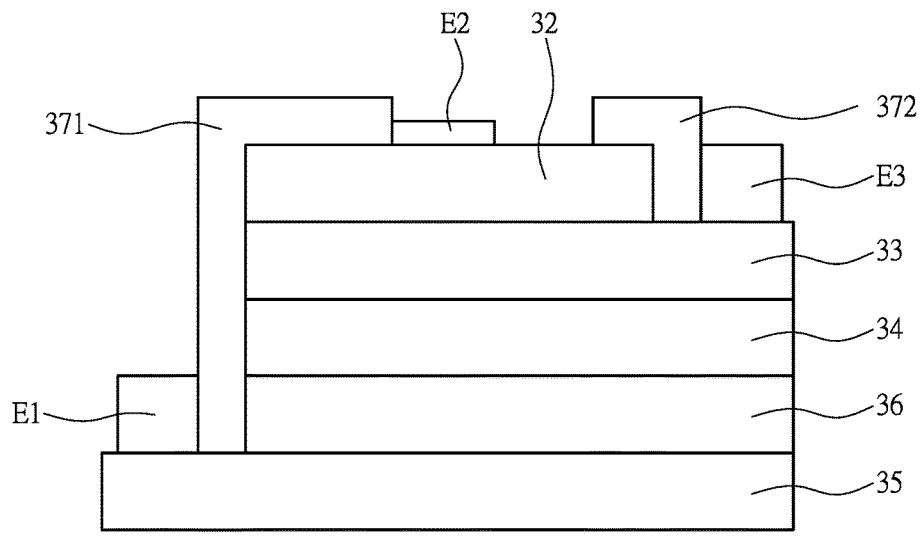
Figure 3H:
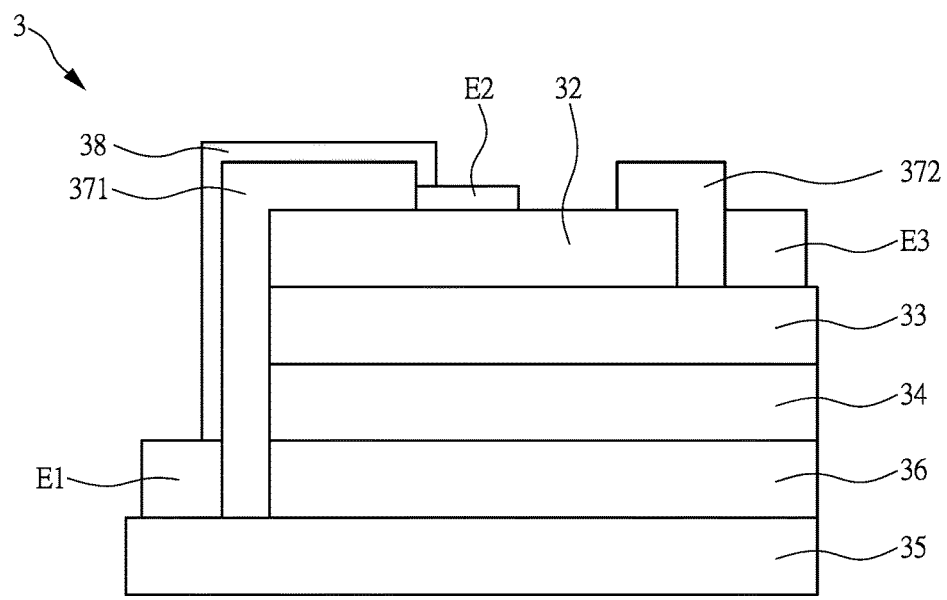

It is noted that as shown in FIG. 3F, after the portions of the insulation layer 37 are removed, insulation layers 371, 372 are formed to respectively cover a part of a surface of the second base plate 35 and a part of a surface of the epitaxial layer 32 and cover a part of the first bonding metal layer 34 on the first side edge, a part of the second bonding metal layer 36 on the first side edge, and a part of the conductive oxide layer 33 on the first side edge.

Further, the first ohmic contact layer E1, the second ohmic contact layer E2, and the third ohmic contact layer E3 do not need to be formed in a specific sequence and may be formed at the same time after the formation of the insulation layers 371, 372.

In the above steps, reduction of a thickness of the second base plate 35 is further included in order to reduce an overall thickness of the light-emitting device 3. The overall thickness of the light-emitting device 3 is set between 80 and 350 micrometers and an actual thickness can be determined according to the needs for practical design and fabrication, such as it would be far less than a thickness of a prior art light-emitting device. The reduction of thickness of the second base plate 35 can be done just to allow for electrical connection, by means of silver glue or solder paste, with signals of a circuit board and ohmic contact layers and allows for bonding, through adhering techniques, of the light-emitting device 3 to the circuit board. The adhering techniques comprise surface mounting techniques and the present invention is not limited thereto.

Further, in the present invention, the conductor line 38 comprises any electrically conductive material for transmission of signals of the first ohmic contact layer E1 and the second ohmic contact layer E2. Thus, by using the conductor line 38 to transmit electrical conduction of the first ohmic contact layer E1 and the second ohmic contact layer E2, rather than using wiring bonding process to connect the first ohmic contact layer E1 and the second ohmic contact layer E2, the operation of packaging the light-emitting device can be simplified and as such, the purpose of size reduction and thinning can be achieved, allowing for applications to the technical field of chip scale package.

Figure 4:
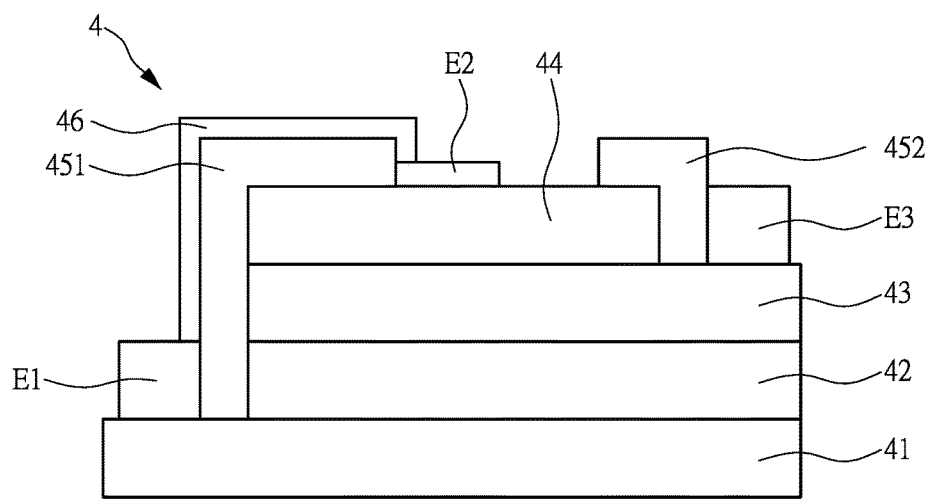
FIG. 4 is a schematic view showing a structure of a light-emitting device according to the present invention.

Referring to FIG. 4, a schematic view is given to illustrate a structure of a light-emitting device according to the present invention. The light-emitting device 4 comprises a base plate 41, a bonding metal layer 42, a conductive oxide layer 43, an epitaxial layer 44, insulation layers 451, 452, a first ohmic contact layer E1, a second ohmic contact layer E2, a third ohmic contact layer E3, and a conductor line 46. The bonding metal layer 42 is disposed on a surface of a first part of the base plate 41. The conductive oxide layer 43 is disposed on the bonding metal layer 42. The epitaxial layer 44 is disposed on a surface of a first part of the conductive oxide layer 43. The insulation layer 451 is disposed on a first side edge of the bonding metal layer 42, the conductive oxide layer 43, and the epitaxial layer 44 the first side edge, and is also disposed on a surface of a first part of the epitaxial layer 44. The first ohmic contact layer E1 is disposed on a surface of a second part of the base plate 41. The second ohmic contact layer E2 is disposed on a surface of a second part of the epitaxial layer 44. The third ohmic contact layer E3 is disposed on a surface of a second part of the conductive oxide layer 43. The conductor line 46 electrically connects the first ohmic contact layer E1 and the second ohmic contact layer E2 to each other.

Figure 5:
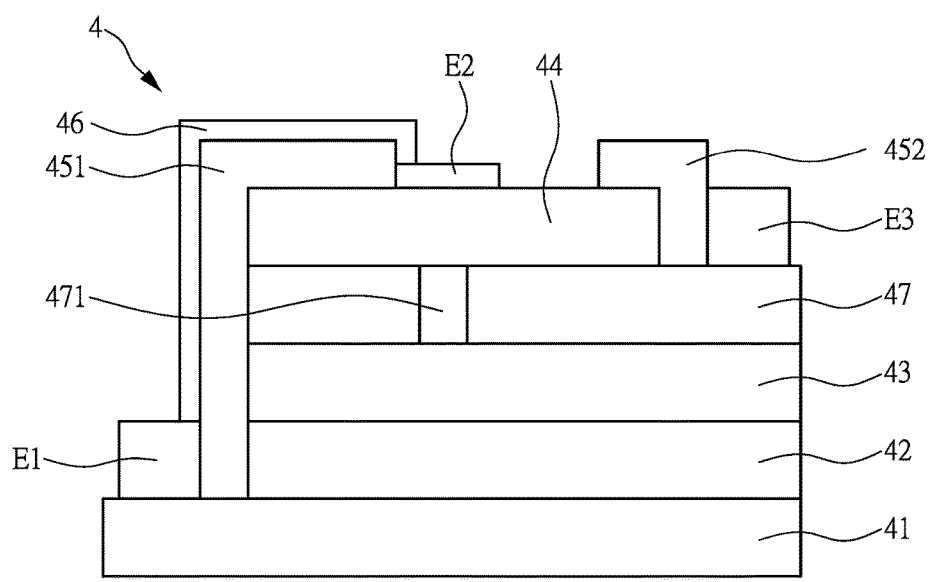
FIG. 5 is a schematic view illustrating a structure of another light-emitting device according to the present invention.

Referring to FIG. 5, a schematic view is given to illustrate a structure of another light-emitting device according to the present invention. Based on the above description, the light-emitting device of the present invention may further comprises a non-conductive oxide layer 47 disposed between the epitaxial layer 44 and the conductive oxide layer 43. The non-conductive oxide layer 47 comprises at least one of silicon nitride (SiNy), silicon oxynitride (SiON) or silicon dioxide. Further, the non-conductive oxide layer 47 comprises at least one via 471 connecting the epitaxial layer 44 and the conductive oxide layer 43 in order to form ohmic contact with the epitaxial layer 44. Further, the via 471 is a metallic material, including metallic materials, such as zinc gold (AuZn), beryllium gold (AuBe), chromium (Cr) or gold (Au).

In an embodiment of the present invention, the base plate 41 comprises a non-conductive plate. The non-conductive plate comprises a ceramic plate, an aluminum nitride plate, or an aluminum oxide plate. In addition, in the present invention, the base plate 41 can be a light-transmitting plate or a non-light-transmitting plate.

The insulation layer 451 comprises silicon dioxide or silicon nitride for isolating the first ohmic contact layer E1 and the second ohmic contact layer E2. In another embodiment of the present invention, the insulation layer 452 is further included, disposed on a surface of a third part of the epitaxial layer 44 and between a second side edge of the epitaxial layer 44 and the third ohmic contact layer E3 to isolate the third ohmic contact layer E3 for preventing shorting.

The conductor line 46 has a width less than a diameter of a solder ball used in a wire bonding process. Generally, the solder ball used in a wire bonding process has a diameter that is greater than 100 um; however, in the present invention, since no wire bonding is necessary, it is possible to easily make a conductor line of any desired width according to practical needs for design and fabrication, such as a conductor line having a width greater than 5 micrometers. In comparison, this is far less than the diameter of the solder ball so that an effect of saving cost can be achieved.

The light-emitting device 4 is bonded to a circuit board by means of adhering techniques, and the circuit board is electrically connected with the second ohmic contact layer E2 and the third ohmic contact layer E3, and silver glue or solder paste is used to electrically connect the conductor line 46 and the third ohmic contact layer E3. In the present invention, the light-emitting device 4 has an overall thickness that is between 80 and 350 micrometers and an actual thickness can be determined according to practical design and fabrication, and in comparison with the prior art, the thickness of the light-emitting device can be greatly reduced.

In summary, compared to the prior art, where a metal ball is disposed on an electrode and a recess is provided for the purposes of making the electrodes identical, in height, to each other, the present invention involves a process of providing a conductor line to more precisely control the height of electrode so as to prevent an issue associated with height difference of electrodes. Further, the light-emitting device of the present invention uses the process of providing a conductor line to connect an ohmic contact layer, instead of wire bonding, so that a package process required by wire bonding can be eliminated to thereby reduce the size of the light-emitting device. Further, the light-emitting device of the present invention, after the formation of the conductor line on the ohmic contact layer, allows for performance of a step of directly bonding to a circuit board so as to reduce the package size and simplify equipment necessary for the package process to thereby further lower down fabrication costs, achieving the effects of simplification of operation and fast fabrication, allowing for wide application to the technical field of chip size package.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A manufacturing method of a light-emitting device, comprising:
   providing a first base plate;
   forming an epitaxial layer on the first base plate;
   forming a conductive oxide layer on the epitaxial layer;
   forming a first bonding metal layer on the conductive oxide layer;
   providing a second base plate;
   forming a second bonding metal layer on the second base plate;
   bonding the first bonding metal layer and the second bonding metal layer to each other;
   removing the first base plate;
   removing a portion of the epitaxial layer;
   removing a portion of the first bonding metal layer, the second bonding metal layer, and the conductive oxide layer;
   forming an insulation layer to cover the second base plate, the first bonding metal layer, the second bonding metal layer, the conductive oxide layer, and the epitaxial layer;
   removing portions of the insulation layer on the second base plate, the conductive oxide layer, and the epitaxial layer to expose, partly, a surface of the second base plate, a surface of the conductive oxide layer, and a surface of the epitaxial layer;
   forming a first ohmic contact layer on the surface of the second base plate;
   forming a second ohmic contact layer on the surface of the epitaxial layer;
   forming a third ohmic contact layer on the surface of the conductive oxide layer; and
   forming a conductor line to connect the first ohmic contact layer and the second ohmic contact layer to each other.

2. The manufacturing method of the light-emitting device as claimed in claim 1 further comprising a step of reducing a thickness of the second base plate.

3. The manufacturing method of the light-emitting device as claimed in claim 2 further comprising a step of bonding the light-emitting device to a circuit board through an adhering technique.

4. The manufacturing method of the light-emitting device as claimed in claim 2, wherein the light-emitting device has a thickness between 80 and 350 micrometers.

5. The manufacturing method of the light-emitting device as claimed in claim 3, wherein the adhering technique comprises surface mounting technology.

6. The manufacturing method of the light-emitting device as claimed in claim 1, wherein the step of removing a portion of the epitaxial layer comprises removing parts of the epitaxial layer on a first side edge and a second side edge to expose a portion of the conductive oxide layer.

7. The manufacturing method of the light-emitting device as claimed in claim 6, wherein the step of removing a portion of the first bonding metal layer, the second bonding metal layer, and the conductive oxide layer comprises removing a part of the first bonding metal layer, the second bonding metal layer, and the conductive oxide layer on the first side edge.

8. The manufacturing method of the light-emitting device as claimed in claim 1, wherein the second base plate comprises a non-conductive plate.

9. The manufacturing method of the light-emitting device as claimed in claim 1, wherein the second base plate comprises a light-transmitting plate or a non-light-transmitting plate.

10. A light-emitting device, comprising:
- a base plate;
- a bonding metal layer, which is disposed on a surface of a first part of the base plate;
- a conductive oxide layer, which is disposed on the bonding metal layer;
- an epitaxial layer, which is disposed on a surface of a first part of the conductive oxide layer;
- an insulation layer, which is disposed on a first side edge of the bonding metal layer, the conductive oxide layer, and the epitaxial layer and is disposed a surface of a first part of the epitaxial layer;
- a first ohmic contact layer, which is disposed on a surface of a second part of the base plate;
- a second ohmic contact layer, which is disposed on a surface of a second part of the epitaxial layer;
- a third ohmic contact layer, which is disposed on a surface of a second part of the conductive oxide layer; and
- a conductor line, which electrically connects the first ohmic contact layer and the second ohmic contact layer to each other.

11. The light-emitting device as claimed in claim 10, wherein the insulation layer comprises silicon dioxide or silicon nitride.

12. The light-emitting device as claimed in claim 10, wherein the insulation layer is further disposed on a surface of a third part of the epitaxial layer and arranged between a second side edge of the epitaxial layer and the third ohmic contact layer.

13. The light-emitting device as claimed in claim 10, wherein the conductor line has a width that is smaller than a diameter of a solder ball.

14. The light-emitting device as claimed in claim 10 further comprising a circuit board electrically connected with the second ohmic contact layer and the third ohmic contact layer.

15. The light-emitting device as claimed in claim 14, wherein the circuit board is electrically connected, through silver glue or solder paste, with the conductor line and the third ohmic contact layer.

16. The light-emitting device as claimed in claim 10, wherein the light-emitting device has a thickness between 80 and 350 micrometers.

17. The light-emitting device as claimed in claim 10, wherein the base plate comprises a non-conductive plate.

18. The light-emitting device as claimed in claim 17, wherein the non-conductive plate comprises a ceramic plate, an aluminum nitride plate, or an aluminum oxide plate.

19. The light-emitting device as claimed in claim 10, wherein the base plate comprises a light-transmitting plate or a non-light-transmitting plate.

20. The light-emitting device as claimed in claim 10 further comprising a non-conductive oxide layer disposed between the epitaxial layer and the conductive oxide layer.

21. The light-emitting device as claimed in claim 20, wherein the non-conductive oxide layer comprises at least one via connected with the epitaxial layer and the conductive oxide layer.

22. The light-emitting device as claimed in claim 21, wherein the via is a metallic material.

23. The light-emitting device as claimed in claim 22, wherein the metallic material comprises zinc gold, beryllium gold, chromium, or gold.

* * * * *